Sept. 4, 1956 A. I. ARONSON 2,761,917

CLASS B SIGNAL AMPLIFIER CIRCUITS

Filed Sept. 30, 1955

INVENTOR.
Albert I. Aronson
BY H. Newton
ATTORNEY 2,761,917
Patented Sept. 4, 1956

2,761,917

CLASS B SIGNAL AMPLIFIER CIRCUITS

Albert I. Aronson, Collingswood, N. J., assignor to Radio Corporation of America, a corporation of Delaware Application September 30, 1955, Serial No. 537,724

11 Claims. (Cl. 179—171)

Figure 1:
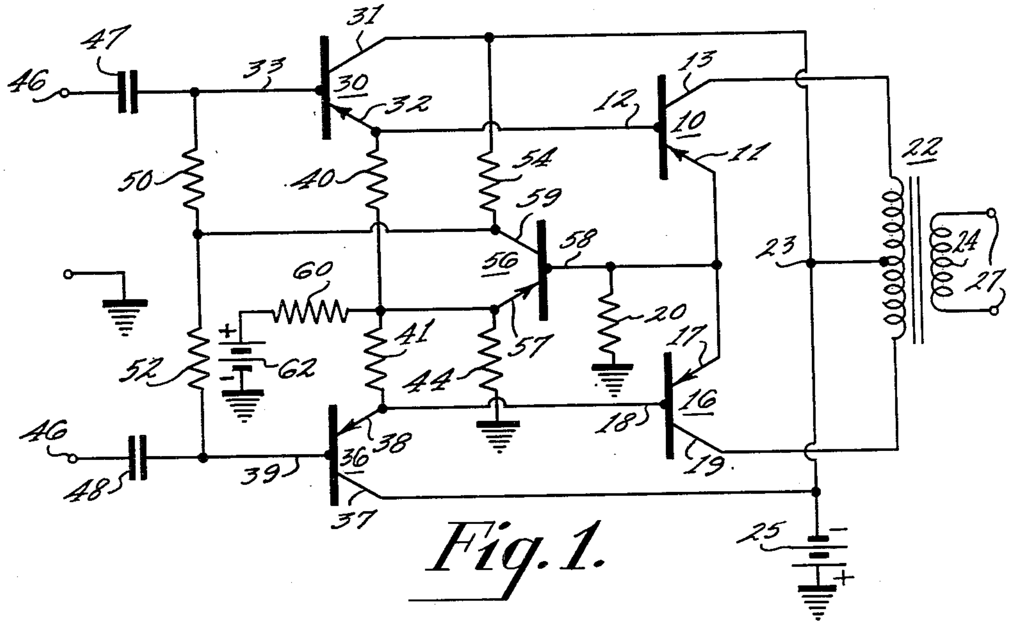

This invention relates generally to transistor signal amplifier circuits and more particularly relates to the stabilization of class AB and class B amplifier circuits for achieving stable low distortion operation.

It is well known that class B operation yields high efficiency under the maximum signal condition, and that during periods of no signal or small signal the energizing current drain is small. This type of operation is therefore desirable particularly where batteries are used to power the amplifier, as in portable equipment, and also in applications requiring a minimum of heat generation, and high power output.

Transistors characteristics are generally temperature dependent, particularly in that the collector current of certain transistors may tend to increase with temperature. Stable operation of transistor amplifier circuits therefore may require the use of special circuits to keep the direct current operating point at a predetermined value, thereby to yield low distortion operation at high power levels under a wide variation of ambient temperature. In class A amplifier circuits, direct current feedback has been found useful to compensate for variations in transistor characteristics. In transistor amplifiers of the class B or class AB type, however, the direct current component of the collector current is dependent upon the amplitude of the signal. Feedback compensation therefore has not generally been found to be successful, since the direct current feedback may be signal amplitude dependent. One form of direct current feedback utilizes a resistor connected between the emitter electrode of the transistor and ground. If this resistor is not bypassed by a capacitor, the gain and the power output of the amplifier is reduced. If, in a class B circuit, this resistor is bypassed, on the other hand, changes in the direct component of the collector current due to signal causes the bypass capacitor to charge, which in turn causes a reverse bias to be applied to the output stage transistor. This leads to a type of distortion which is termed cross-over distortion.

Accordingly, this invention has as a principal object thereof, the provision of an improved class B amplifier circuit wherein stable and distortion-free operation is provided.

It is another object of the present invention to provide an improved direct coupled class B signal amplifier circuit utilizing transistors wherein a feedback balancing circuit is employed to provide stable, low distortion, and efficient transistor operation.

Broadly, the invention lies in the manner in which a change in the operating point of a class B amplifier, caused for example, by a temperature change, is sensed separately from signal induced direct energizing current changes. A corrective bias is derived from the operating point change, and is applied to the input circuit of the amplifier to stabilize the operation thereof.

A signal amplifier circuit in accordance with the invention includes an output stage and a driver stage connected in cascade direct-coupled relation. Each of these stages includes a pair of transistors connected and biased for class B operation. An impedance element is connected serially in the output current circuit of each of the driver and output stages, one end of each of the impedance elements being connected to a common circuit point. In operation, the voltage across each of these elements will have a direct and an alternating component. The alternating component is a full-wave rectified signal arising from class B operation of the driver and output stages. The two impedance elements are proportioned such that equal alternating voltages appear across them under normal operating conditions. Any difference in voltage across the two elements is amplified by a control transistor and applied as input circuit bias for the driver stage to control the direct idling current of the driver stage. A change in the voltage difference across the two elements caused by a change in the characteristics of the output stage transistors thereby causes the driver stage bias to be modified in a direction to oppose the change. The output stage bias is likewise modified by virtue of the direct coupling between the driver and output stages. Since the alternating voltage appearing across the two resistors is equal, no signal is fed back. The gain of the amplifier circuit is therefore not reduced by feedback, while effective correction for changes in the operating point is provided.

Figure 2:
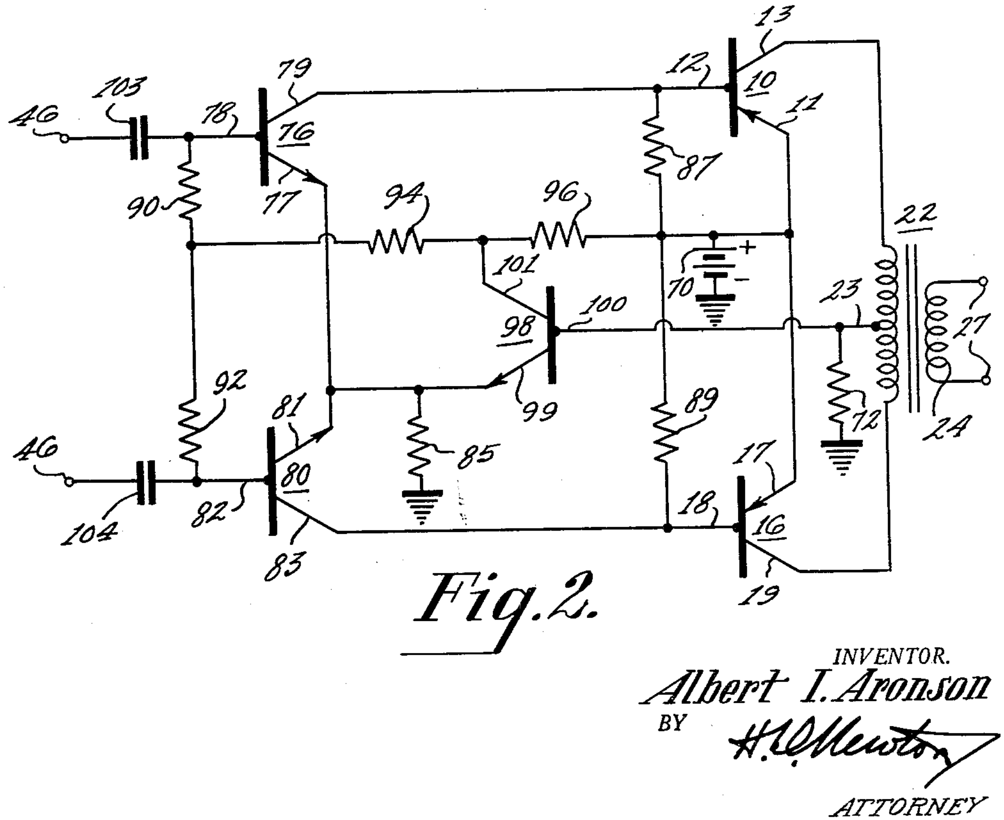

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a transistor signal amplifier circuit embodying the invention; and Figure 2 is a schematic circuit diagram of a transistor signal amplifier circuit illustrating a further embodiment of the invention.

Reference is first made to Figure 1 in which a class B output stage includes a pair of transistors 10 and 16 each including emitter electrodes 11 and 17 connected in common to one end of a resistor 20 the other end of which is connected to a common circuit point or ground. The transistors 10 and 16 further include a pair of base electrodes 12 and 18 and a pair of collector electrodes 13 and 19, respectively. The collector electrodes 13 and 19 are connected to opposite ends of the primary winding of an output transformer 22 which has a center tap 23 connected through a source of energizing potential illustrated as a battery 25 to ground. A secondary winding 24 of the output transformer 22 is connected to a pair of output terminals 27 to which a utilization device such as a loudspeaker may be connected. The resistor 20 is thus connected in the output current circuit of the pair of transistors 10 and 16 and a voltage is developed thereacross which is proportional to the total current flowing in the output circuits of the transistors 10 and 16.

The transistors 10 and 16 are illustrated as PNP transistors of the junction type. Other types of transistors may also be utilized for the output stage as well as for the remainder of the transistors in the circuit provided that suitable connections are made to a source of energizing potential. Transistors of the NPN type, for example, may be utilized merely by reversing the polarity of the battery 25.

A driver stage including a second pair of transistors 30 and 36 is connected in cascade direct-coupled relation with the output stage. The transistors 30 and 36 are connected, in the embodiment illustrated in Figure 1, in a common collector arrangement or configuration. The collector electrodes 31 and 37 of the second pair of transistors 30 and 36, respectively, are connected to the negative terminal of the battery 25. A pair of emitter electrodes 32 and 38 of the transistors 30 and 36, respectively, are directly connected to the base electrodes 12 and 18. Alternating current signals and direct current bias for the output stage are developed across a pair of emitter load resistors 40 and 41 connected in series relation between the emitter electrodes 32 and 38. The junction of the emitter load resistors 40 and 41 is connected to ground through a resistor 44. The transistors 30 and 36 further include a pair of base electrodes 33 and 39 which are connected one to each of a pair of input terminals 46 through a pair of coupling capacitors 47 and 48, respectively. Input circuit biasing for the base electrodes 33 and 39 is in part accomplished by the connection of a pair of bias resistors 50 and 52 connected in series relation in the order named between the base electrodes 33 and 39. The junction of the pair of bias resistors 50 and 52 is connected through a resistor 54 to the negative terminal of the battery 25 in order to provide forward bias to the base electrodes 33 and 39.

A control transistor 56, including an emitter electrode 57, a base electrode 58 and a collector electrode 59, has its base emitter path connected to sense the voltage difference between the ungrounded ends of the resistors 44 and 20. The base electrode 58 is connected in common to the emitter electrodes 11 and 17, and the emitter electrode 57 is connected to the junction of the emitter load resistors 40 and 41. A bias current supply illustrated as the series combination of a resistor 60 and a battery 62 is connected between the emitter electrode 57 and ground. The collector electrode 59 is connected to the junction of the driver stage bias resistors 50 and 52 so that the potential at the collector electrode 59 controls the bias applied to the base electrodes 33 and 39 of the driver stage.

In operation, and in response to an input signal applied between the base electrodes 33 and 39, an alternating wave corresponding to the full-wave-rectified input signal appears across the resistor 44 because of the class B operation of the driver circuit. This wave is applied to the emitter electrode 57. Driver stage signal output from the emitter electrodes 32 and 38 is applied directly to the base electrodes 12 and 18 causing signal currents to flow in the collector-emitter circuits of the output stage transistors 10 and 16. A full-wave-rectified alternating wave, in phase with the alternating wave across the resistor 44, appears across the resistor 20 because of class B operation of the output stage. The magnitudes of these two waves are made equal by an adjustment of the relative values of the resistors 44 and 20. Accordingly, variations in the direct and alternating voltages which are induced by applied signals will produce no current to the control transistor 56 between the base electrode 58 and the emitter electrode 57, and the collector voltage 59 will be unaffected by these input signals. If, however, the output circuit current of the output stage tends to rise because of increased temperature, for example, an unbalanced voltage is applied between the emitter electrode 57 and the base electrode 58 in such a direction to cause increased conduction of the transistor 56. Accordingly, the voltage at the collector electrode 59 is reduced in magnitude, or in other words, becomes less negative. The bias applied to the base electrodes 33 and 39 is thereby reduced so that the collector current of the transistors 30 and 36 is reduced which in turn causes a reduced bias to be applied to the base electrodes 12 and 18, thereby counteracting the original increase in the direct output circuit current of the transistors 10 and 16. The system is thereby sensitively corrective to operating point changes while relatively insensitive to signal-induced direct effects.

In Figure 2, to which reference is now made, an output stage similar to that described with reference to Figure 1 includes a pair of transistors 10 and 16 having a pair of emitter electrodes 11 and 17, respectively, connected to ground through a source of energizing potential illustrated as a battery 70. The pair of transistors 10 and 16, respectively, includes a pair of collector electrodes 13 and 19 connected to opposite ends of the primary winding of an output transformer 22 which has a center tap 23 connected to ground through a resistor 72. A secondary winding 24 of the output transformer is connected to a pair of output terminals 27 to which a utilization device such as a loudspeaker may be connected. The pair of transistors 10 and 16 further includes a pair of base electrodes 12 and 18, respectively, connected to the collector electrodes 79 and 83 of a pair of driver transistors 76 and 80 of a push-pull class B driver stage of the common emitter type. The driver transistors 76 and 80 further include, respectively, a pair of base electrodes 78 and 82 and a pair of emitter electrodes 77 and 81. The emitter electrodes 77 and 81 are connected in common to one terminal of a resistor 85, the other end of which is connected to ground. The collector electrodes 79 and 83 are connected through a pair of load resistors 87 and 89, respectively, to the positive terminal of the battery 70. A pair of bias resistors 90 and 92 are connected in series relation between the base electrodes 78 and 82, the junction of the resistors 90 and 92 being connected through the series combination of a pair of resistors 94 and 96 to the positive terminal of the battery 70.

The driver transistors 76 and 80 are illustrated to be of the NPN junction type while the transistors 10 and 16 are illustrated as PNP type transistors. Transistors of opposite conductivity type could be used provided that the polarity of the battery 70 be reversed.

A control transistor 98 includes an emitter electrode 99 which is connected to the emitter electrodes 77 and 81. The transistor 98 further includes a base electrode 100 which is connected directly to the center tap 23 of the output transformer 22 and a collector electrode 101 which is connected to the junction of the resistors 94 and 96. Thus, any difference in the voltages across the resistors 85 and 72 will cause a current to flow in the base emitter path of the transistor 98 which will in turn cause the voltage at the collector electrode 101 to vary in such direction as to reduce the difference in the two voltages across the resistors 85 and 72. This is accomplished by virtue of the change in base current bias of the transistors 76 and 80 caused by variation of the voltage at the collector electrode 101.

Input signals applied to a pair of input terminals 46 are coupled to the base electrodes 78 and 82, respectively, through a pair of coupling capacitors 103 and 104. By virtue of the class B operation of the driver stage full wave rectification of the input signal will occur in the emitter circuit of the transistors 78 and 80, and will give rise to a signal induced direct current component in the resistor 85. Simultaneously, however, signals are direct coupled from the collector electrodes 79 and 83 of the driver stage transistors to the base electrodes of the output stage transistors causing a full-wave rectified voltage to appear across the resistor 72. The values of the resistors 85 and 72 are adjusted so that in normal operation no signal induced voltage is applied between the base electrode 100 and the emitter electrode 99. If the collector current in the output stage tends to rise independently of the driver stage collector current, because of heat generated in the output stage transistors or because of high ambient temperature, the transistor 98 will conduct more heavily causing less forward bias to be applied to the driver stage transistors 76 and 80. The collector current of the driver stage transistors will thereby be reduced and a reverse bias will be applied from the battery 70 to the output stage transistors 10 and 16 which will tend to counteract the rise in collector current of these transistors because of temperature effects. Thus, as in the case of the circuit described with reference to Figure 1, direct current feedback independent of signal is employed to stabilize the operating point of the class B output stage transistors 10 and 16.

Class B signal amplifier circuits in accordance with the invention provide stable operation over a wide range of temperature conditions with very little loss in gain or power output. Direct current feedback is utilized in a class B amplifier without difficulties arising from the variation of direct energizing current with signal level. By providing optimum bias for the class B circuit, relatively distortion-free operation is obtained.

What is claimed is:

1. A signal amplifier comprising in combination, an output stage and a driver stage connected in cascade direct-coupled relation, each of said stages including a pair of transistors connected and biased for push-pull class B signal amplifying circuit operation, a stabilizing circuit for said transistors including first means connected in said circuit to provide a first voltage in response to current flow through the transistors of said output stage, second means connected in said circuit to provide a second voltage in response to current flow through the transistors of said driver stage, and means including a control transistor connected for deriving and amplifying the difference voltage between said first and second voltages and applying the resulting amplified difference voltage as corrective bias to said driver stage to stabilize the operation of said signal amplifier.

2. A signal amplifier comprising in combination, an output stage and a driver stage connected in cascade direct-coupled relation each including a pair of transistors connected and biased for push-pull class B signal amplifying circuit operation, stabilizing circuit means for said transistors connected in circuit with the transistors of said output and driver stages to provide a first voltage of predetermined magnitude in response to current flow through the transistors of said output stage and a second voltage of a predetermined different magnitude in response to current flow through the transistors of said driver stage, and means including a control transistor connected for deriving and amplifying the difference voltage between said first and second voltages and applying the resulting amplified difference voltage as a corrective bias voltage to the transistors of the driver stage for stabilizing the circuit operation of said signal amplifier.

3. A signal amplifier comprising in combination, an output stage and a driver stage connected in cascade direct-coupled relation, each of said stages including a pair of transistors connected and biased for push-pull class B signal amplifying circuit operation, a stabilizing circuit for said transistors including a first resistor connected in circuit to provide a first voltage in response to current flow through the transistors of said output stage, a second resistor connected in circuit to provide a second voltage in response to current flow through the transistors of said driver stage, and means including a control transistor connected for deriving and amplifying the difference voltage between said first and second voltages and applying the resulting amplified difference voltage as corrective bias to said driver stage for stabilizing the operation of said signal amplifier.

4. A signal amplifier circuit comprising in combination an output stage and a driver stage connected in cascade direct-coupled relation, each of said stages including a pair of transistors connected and biased for push-pull class B signal amplifying circuit operation, a stabilizing circuit for each of said transistors including first means connected in circuit to provide a first voltage in response to current flow through the transistors of said output stage, second means connected in circuit to provide a second voltage in response to current flow through the transistors of said driver stage, a control transistor having an input electrode, an output electrode and a third electrode, said input electrode being connected to said first means, said third electrode being connected to said second means and a bias circuit coupled between said output electrode and said driver stage for stabilizing the operation of said signal amplifier circuit.

5. In a push-pull signal amplifier circuit, the combination with an output stage and a driver stage connected in cascade direct-coupled relation, each of said stages including a pair of transistors connected and biased for push-pull class B signal amplifying circuit operation, of stabilizing circuit means for each of said transistors including a first impedance element connected in circuit with the transistors of said output stage, a second impedance element connected in circuit with the transistors of said driver stage, a control transistor having an input electrode, an output electrode and a third electrode, said input electrode being connected to one of said impedance elements, said third electrode being connected to the other of said impedance elements, and bias means coupled between said output electrode and said driver stage for stabilizing the operation of said output stage.

6. In a push-pull signal amplifier circuit, stabilizing circuit means as defined in claim 5 wherein said first and said second impedance elements are resistors.

7. A signal amplifier circuit comprising in combination, an output stage and a driver stage connected in cascade direct-coupled relation, each of said stages including a pair of transistors connected and biased for push-pull class B signal amplifying circuit operation, a stabilizing circuit for each of said transistors including a first resistor connected in circuit with the transistors of said output stage to provide a first voltage in response to current flow therethrough, a second resistor connected in circuit with the transistors of said driver stage to provide a second voltage in response to current flow therethrough, a control transistor having an input electrode, an output electrode and a third electrode, said input electrode being connected to said first resistor, said third electrode being connected to said second resistor, and a bias circuit coupled between said output electrode and said driver stage for stabilizing the operation of said signal amplifier circuit.

8. In a push-pull signal amplifier circuit the combination with an output stage and a driver stage connected in cascade direct-coupled relation, each of said stages including a pair of transistors connected and biased for push-pull class B signal amplifying circuit operation, each of said transistors including base, emitter and collector electrodes, of stabilizing means for each of said transistors including a first impedance element connected in common with the emitter electrodes of the transistors of said output stage, a second impedance element connected in common with the emitter electrodes of the transistors of said driver stage, a control transistor having an input electrode, an output electrode and a third electrode, said input electrode being connected to one of said impedance elements, said third electrode being connected to the other of said impedance elements, and bias means coupled between said output electrode and the base electrodes of said driver stage for stabilizing the operation of the transistors of said amplifier circuit.

9. In a push-pull signal amplifier the combination with an output stage and a driver stage connected in cascade direct-coupled relation, each of said stages including a pair of transistors connected and biased for push-pull class B signal amplifying circuit operation, each of said transistors including base, emitter and collector electrodes, of stabilizing means for each of said transistors including a first impedance element connected in common with the collector electrodes of the transistors of said output stage, a second impedance element connected in common with the emitter electrodes of the transistors of said driver stage, a control transistor having an input electrode, an output electrode and a third electrode, said input electrode being connected to one of said impedance elements, said third electrode being connected to the other of said impedance elements, and bias means coupled between said output electrode and the base electrodes of said driver stage for stabilizing the operation of said output amplifier.

10. A signal amplifier circuit comprising in combination, a class B output stage and a class B driver stage, each of said stages including a pair of transistors each having base, emitter and collector electrodes, means connecting said stages in cascade direct-coupled relation, circuit means including a pair of resistors connected with the emitter electrodes of each of said stages for providing a control signal voltage in response to the emitter electrode current of the pair of transistors of each of said stages, said pair of resistors having a predetermined relative magnitude to provide thereacross two substantially equal control signal voltages under a predetermined operating condition of said transistors, and control means including a control transistor having input, output and common electrodes, said input and common electrodes being coupled respectively one to each of said pair of resistors for deriving an input current for said control transistor in response to a change in said predetermined operating condition, and bias network means connected with said output electrode for providing bias for said driver stage, whereby the operation of said amplifier circuit is stabilized.

11. A signal amplifier circuit comprising in combination a class B output stage and a class B driver stage, each of said stages including a pair of transistors each having base, emitter and collector electrodes, means connecting said stages in cascade direct-coupled relation, circuit means including a pair of resistors, one of said pair of resistors being connected with the emitter electrodes in common of said driver stage said stages for providing a voltage in response to the emitter electrode current of the pair of transistors of said driver stage, the other of said pair of resistors being connected with the collector electrodes in common of said output stage for providing a voltage in response to the collector electrode current of the pair of transistors of said output stage, said pair of resistors having a predetermined relative magnitude to provide thereacross two substantially equal control signal voltages under a predetermined operating condition of said transistors, and control means including a control transistor having input, output and common electrodes, said input and common electrodes being coupled respectively one to each of said pair of resistors for deriving an input current for said control transistor in response to a change in said predetermined operating condition, and bias network means connected with said output electrode for providing bias for said driver stage, whereby the operation of said amplifier circuit is stabilized.

No references cited.